(12) United States Patent
Hirano et al.

(10) Patent No.: US 6,552,413 B1
(45) Date of Patent: Apr. 22, 2003

(54) DIODE

(75) Inventors: Noritoshi Hirano, Fukuoka (JP); Katsumi Satoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 66 days.

(21) Appl. No.: 09/617,114

(22) Filed: Jul. 14, 2000

(30) Foreign Application Priority Data

Jan. 11, 2000 (JP) ........................................ 2000-002337

(51) Int. Cl.[7] ...................... H01L 29/861; H01L 31/107
(52) U.S. Cl. .................. 257/603; 257/604; 257/605; 257/606; 257/481; 257/104; 257/106; 438/379; 438/380; 438/979; 438/983
(58) Field of Search ................... 257/551, 339, 257/342, 104, 106, 603, 656, 595, 9, 137, 138, 139, 143, 480, 481, 482, 497, 498, 604, 605, 606, 341, 147, 149; 438/979, 983, 91, 380, 379

(56) References Cited

U.S. PATENT DOCUMENTS

| | | | | |
|---|---|---|---|---|
| 5,081,509 A | * | 1/1992 | Kozaka et al. | 357/13 |
| 5,432,360 A | * | 7/1995 | Kim et al. | 257/104 |
| 5,612,568 A | * | 3/1997 | Arai | 257/481 |
| 5,668,385 A | * | 9/1997 | Bauer et al. | 257/139 |

FOREIGN PATENT DOCUMENTS

| | | | |
|---|---|---|---|
| JP | 54-106176 A | * | 8/1979 |
| JP | 8-316501 | | 11/1996 |

* cited by examiner

*Primary Examiner*—Steven Loke
*Assistant Examiner*—Donghee Kang
(74) *Attorney, Agent, or Firm*—Oblon, Spivak, McClelland, Maier & Neustadt, P.C.

(57) ABSTRACT

Implemented is a diode which controls an energy loss produced during a reverse recovery operation and generates an oscillation of an applied voltage with difficulty even if a reverse bias voltage has a great value. An N layer 101 and a P layer 102 are formed in a semiconductor substrate such as silicon. Furthermore, a cathode side P layer 103 is also formed facing a cathode electrode 105 in a position on the N layer 101 that a depletion layer extended during application of a reverse bias voltage does not reach. By providing the cathode side P layer 103, a current density of a reverse current obtained during a reverse recovery operation can be increased, the sudden change of a resistance component of a diode can be prevented and the generation of a voltage oscillation can be suppressed. The cathode side P layer 103 has a diameter W of approximately 400 μm or less and a rate of an area of the cathode side P layer 103 occupying a cathode surface is kept at approximately ⅖ or less. Consequently, it is possible to suppress the voltage oscillation without increasing a forward voltage and an energy loss produced during the reverse recovery operation.

8 Claims, 4 Drawing Sheets

DIODE

BACKGROUND OF THE INVENTION

1. Field of the Invention

The present invention relates to a diode which requires a high breakdown voltage and a quick reverse recovery characteristic, for example, a free—wheeling diode, a voltage clamp diode or the like which is to be used together with a high breakdown voltage power semiconductor device such as an IGBT (Insulated Gate Bipolar Transistor), a GCT (Gate Commutated Turn—off Thyristor) or the like.

2. Description of the Background Art

FIG. 8 is a view showing a sectional structure of a conventional diode. The diode comprises an N layer 501 formed in a semiconductor substrate such as silicon, a P layer 502 formed adjacently to the N layer 501, an $N^+$ layer 503 formed adjacently to the N layer 501 on the opposite side of the P layer 502 and having a higher impurity concentration than the impurity concentration of the N layer 501, an anode electrode 504, and a cathode electrode 505. The $N^+$ layer 503 is provided to increase a carrier concentration, thereby making the diode thinner. The $N^+$ layer 503 is not provided in the vicinity of the P layer 502 but on the cathode electrode 505 side in order to effectively increase a carrier concentration except a portion to be depleted.

When a reverse bias voltage is applied, by the instantaneous switching of an external circuit, to the diode in which a current flows forward, the magnitude of the current is reduced to 0, and furthermore, a great current flows in an opposite direction for a certain period. This is a transient phenomenon caused by the movement of minority carriers stored in the diode. A reverse current decreases with a decrease ratio comprising, as parameters, a value of a reverse bias voltage to be applied and a value of an inductance of the external circuit and continuously flows until a concentration of excess carriers in the vicinity of a PN junction is reduced to a certain concentration or less to form a depletion layer. A value obtained by integrating a product of the reverse current and the reverse bias voltage value with respect to time is an energy loss consumed during a reverse recovery operation.

In order to enhance the reverse recovery characteristic, a proton is often irradiated in the vicinity of a PN junction formed on a boundary surface of the N layer 501 and the P layer 502. Consequently, a recombination center of a carrier is formed and a life time of the carrier is controlled to be shortened. Moreover, the diffusion of a heavy metal, the irradiation of electron beams and the like are carried out over the whole semiconductor substrate and the life time of the carrier is similarly controlled. If the life time of the carrier is shortened, the number of the minority carriers to be stored is decreased. Consequently, the value of the reverse current can be controlled.

In the conventional diode described above, the current can be reduced during the reverse recovery operation by controlling the life time of the carrier in the vicinity of the PN junction to be shortened and the energy loss can be controlled.

In the case in which a great reverse bias voltage value is applied during the reverse recovery operation, however, there is a problem in that the voltage to be applied to the diode is rapidly oscillated to easily make EMI (Electro—Magnetic Interference) noises to cause a malfunction of peripheral electric machinery and apparatus. It is supposed that the variation in the voltage is caused in the following manner.

More specifically, during the reverse recovery operation, the diode has a capacitance component comprising, as parameters, a distance of a depletion layer and the number of excess carriers and a resistance component comprising, as parameters, a value of an applied reverse bias voltage and values of a leakage current and a current flowing by the movement of the excess carriers. By adding an inductance component of an external circuit for applying a reverse bias voltage to the capacitance component and the resistance component of the diode, an LCR series circuit is formed. The capacitance component and the resistance component of the diode are changed on a time basis with an enlargement of the depletion layer. Particularly the resistance component is rapidly increased when the depletion layer is generated so that a concentration distribution of the excess carriers is changed. If the natural oscillating conditions of the LCR series circuit are met by the change in the capacitance component and the resistance component, a voltage oscillation is caused.

Moreover, when the depletion layer reaches the $N^+$ layer 503, the resistance component is changed suddenly. Consequently, it is also supposed that a trigger is generated to cause a voltage oscillation.

SUMMARY OF THE INVENTION

In order to solve the above-mentioned problems, it is an object of the present invention to implement a diode in which an energy loss is controlled during a reverse recovery operation and an applied voltage is oscillated with difficulty even if a reverse bias voltage has a great value.

A first aspect of the present invention is directed to a diode comprising a semiconductor substrate having a first main surface and a second main surface opposed to the first main surface, a first semiconductor region of a first conductivity type which faces the first main surface and is formed in the semiconductor substrate, a second semiconductor region of a second conductivity type which faces the second main surface and is formed in the semiconductor substrate adjacently to the first semiconductor region, at least one third semiconductor region of the first conductivity type formed in a position on the second semiconductor region facing the second main surface that a depletion layer extended from a boundary surface of the first and second semiconductor regions with application of a reverse bias voltage does not reach, a first electrode formed on the first main surface, and a second electrode formed on the second main surface.

A second aspect of the present invention is directed to the diode according to the first aspect of the present invention, wherein the second semiconductor region has a higher impurity concentration in second main surface side than in first semiconductor region side.

A third aspect of the present invention is directed to the diode according to the first or second aspect of the present invention, wherein a diameter of a portion of the third semiconductor region which faces the second main surface is approximately 400 μm or less.

A fourth aspect of the present invention is directed to the diode according to any of the first to third aspects of the present invention, wherein a total area of a portion of the third semiconductor region which faces the second main surface is approximately ⅔ or less of an area of the second main surface.

A fifth aspect of the present invention is directed to a diode comprising a semiconductor substrate having a first main surface and a second main surface opposed to the first main surface, a first semiconductor region of a first conductivity type which faces the first main surface and is formed in the semiconductor substrate, a second semiconductor region of a second conductivity type which faces the second main surface and is formed in the semiconductor substrate adjacently to the first semiconductor region, at least one third semiconductor region of the first conductivity type which faces the second main surface and is formed in the second semiconductor region, a first electrode formed on the first main surface, and a second electrode formed on the second main surface, wherein a diameter of a portion of the third semiconductor region which faces the second main surface is approximately 400 µm or less.

A sixth aspect of the present invention is directed to a diode comprising a semiconductor substrate having a first main surface and a second main surface opposed to the first main surface, a first semiconductor region of a first conductivity type which faces the first main surface and is formed in the semiconductor substrate, a second semiconductor region of a second conductivity type which faces the second main surface and is formed in the semiconductor substrate adjacently to the first semiconductor region, at least one third semiconductor region of the first conductivity type which faces the second main surface and is formed in the second semiconductor region, a first electrode formed on the first main surface, and a second electrode formed on the second main surface, wherein a total area of a portion of the third semiconductor region which faces the second main surface is approximately ⅖ or less of an area of the second main surface.

A seventh aspect of the present invention is directed to the diode according to the fifth or sixth aspect of the present invention, wherein the second semiconductor region has a higher impurity concentration in second main surface side than in first semiconductor region side.

According to the first aspect of the present invention, at least one third semiconductor region is formed in the position on the second semiconductor region facing the second main surface that the depletion layer extended from the boundary surface of the first and second semiconductor regions with the application of the reverse bias voltage does not reach. Therefore, a current density of a reverse current obtained during a reverse recovery operation can be increased, a resistance component of the diode can be prevented from being suddenly changed and a voltage oscillation can be prevented from being generated.

According to the second aspect of the present invention, the second semiconductor region has a higher impurity concentration in second main surface side than in first semiconductor region side. Therefore, a carrier concentration in the second semiconductor region can be increased except a portion to be depleted. Thus, the diode can be made thinner. Furthermore, the carrier concentration is increased. Consequently, the reverse current obtained during the reverse recovery operation can be more increased between the second semiconductor region and the third semiconductor region. Thus, the sudden change of the resistance component of the diode and the generation of the voltage oscillation can be prevented more reliably.

According to the third aspect of the present invention, the portion of the third semiconductor region which faces the second main surface has a diameter of approximately 400 µm or less. Therefore, it is possible to prevent the voltage oscillation without increasing a forward voltage and an energy loss produced during the reverse recovery operation.

According to the fourth aspect of the present invention, the portion of the third semiconductor region which faces the second main surface has a total area of approximately ⅖ or less of the area of the second main surface. Therefore, it is possible to effectively control the energy loss produced during the reverse recovery operation without increasing the forward voltage.

According to the fifth aspect of the present invention, at least one third semiconductor region is formed in the second semiconductor region facing the second main surface. Therefore, the current density of the reverse current obtained during the reverse recovery operation can be increased, the sudden change of the resistance component of the diode can be prevented and the generation of the voltage oscillation can be suppressed. Moreover, the portion of the third semiconductor region which faces the second main surface has a diameter of approximately 400 µm or less. Therefore, it is possible to suppress the voltage oscillation without increasing the forward voltage and the energy loss produced during the reverse recovery operation.

According to the sixth aspect of the present invention, at least one third semiconductor region is formed in the second semiconductor region facing the second main surface. Therefore, the current density of the reverse current obtained during the reverse recovery operation can be increased, the sudden change of the resistance component of the diode can be prevented and the generation of the voltage oscillation can be suppressed. Moreover, the portion of the third semiconductor region which faces the second main surface has a total area of approximately ⅖ or less of the area of the second main surface. Therefore, it is possible to effectively control the energy loss produced during the reverse recovery operation without increasing the forward voltage.

According to the seventh aspect of the present invention, the second semiconductor region has a higher impurity concentration in second main surface side than in first semiconductor region side. Therefore, a carrier concentration in the second semiconductor region can be increased except a portion to be depleted. Thus, the diode can be made thinner. Furthermore, the carrier concentration is increased. Consequently, the reverse current obtained during the reverse recovery operation can be more increased between the second semiconductor region and the third semiconductor region. Thus, the sudden change of the resistance component of the diode and the generation of the voltage oscillation can be prevented more reliably.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A diode according to the present invention is provided with at least one P layer in a position on an N layer at the cathode side that a depletion layer does not reach, thereby increasing a reverse current during a reverse recovery operation to prevent a resistance component of the diode from being changed suddenly and to inhibit a voltage oscillation from being generated.

Figure 1:
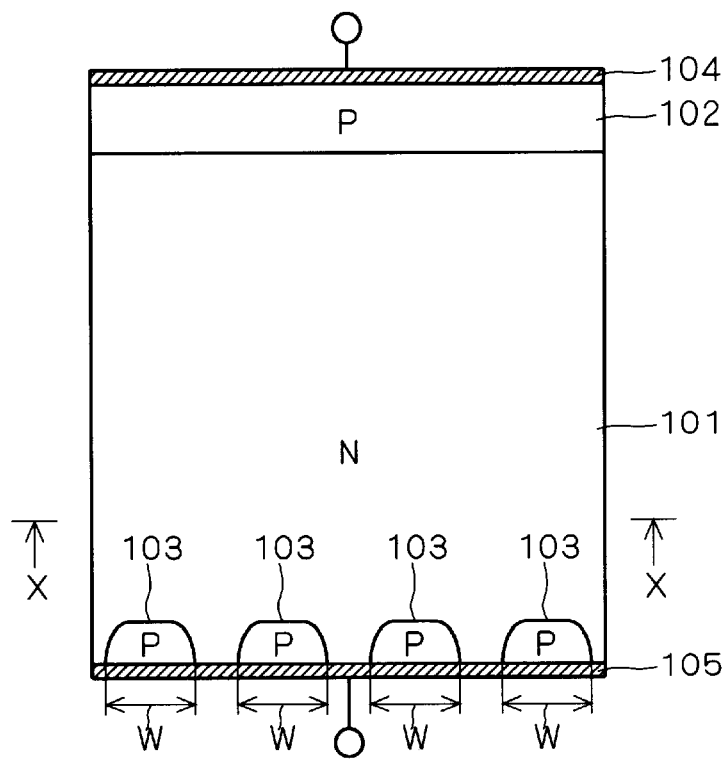
FIG. 1 is a sectional view showing a diode according to a first embodiment.
Figure 2:
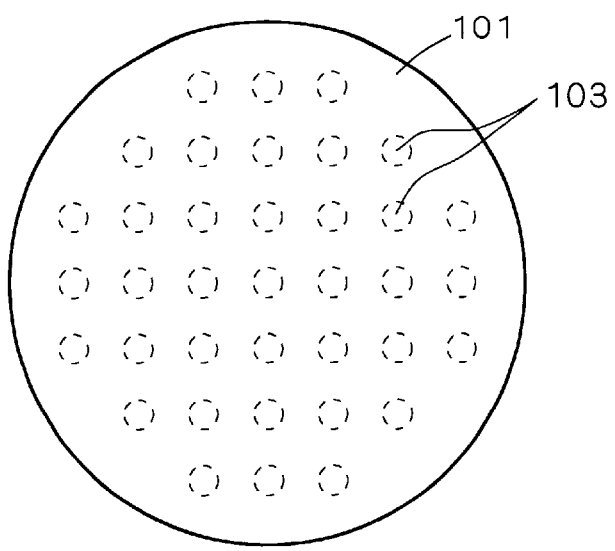
FIG. 2 is a view showing a section taken along the line X—X in FIG. 1 as seen from above.

FIG. 1 is a sectional view showing a diode according to a first embodiment of the present invention. The diode comprises an N layer 101 formed in a semiconductor substrate such as silicon, a P layer 102 formed adjacently to the N layer 101, an anode electrode 104, and a cathode electrode 105. Furthermore, the diode also comprises a cathode side P layer 103 formed facing the cathode electrode 105 in a position on the N layer 101 that a depletion layer extended from a boundary surface of the N layer 101 and the P layer 102 during application of a reverse bias voltage does not reach. For the following reason, the cathode side P layer 103 is provided in the position on the N layer 101 that the depletion layer extended during the application of the reverse bias voltage does not reach. More specifically, the depletion layer should be prevented from reaching the cathode side P layer 103 to cause a punch through current to flow to the diode, resulting in a deterioration in rectification. FIG. 2 is a view showing a section taken along the line X—X in FIG. 1 as seen from above.

With such a structure as to provide the cathode side P layer 103 in the N layer 101, thus, a hole in the cathode side P layer 103 is implanted into the N layer 101 during the application of the reverse bias voltage. The implanted hole has the function of increasing a minority carrier concentration in the N layer 101 to control a speed at which a depletion layer is enlarged in the N layer 101. From a different viewpoint, it is also obvious that a current density of the reverse current is increased to some extent during the reverse recovery operation to reduce a resistance component during the reverse recovery operation of the diode.

With the above-mentioned structure, it is possible to reduce the resistance component during the reverse recovery operation of the diode, thereby meeting the natural oscillating conditions of an LCR series circuit with difficulty to prevent a voltage oscillation from being generated.

With a structure in which the cathode side P layer 103 is provided in the N layer 101, a reverse bias is applied between the N layer 101 and the cathode side P layer 103 during application of a forward bias in the diode. Therefore, it is supposed that a forward voltage necessary for operating the diode is increased during the application of the forward bias.

Moreover, it is also necessary to know how far the magnitude of the voltage oscillation can be controlled with the cathode side P layer 103 provided. Furthermore, it is supposed that a value of an energy loss is also affected during the reverse recovery operation by the cathode side P layer 103.

The present inventors carried out a simulation for a relationship between each of a forward voltage Vf, an energy loss Erec produced during the reverse recovery operation and a magnitude $V_{p-p}$ of a voltage oscillation (which is a difference in a voltage from a peak to a peak) and a diameter W of the cathode side P layer 103, thereby performing a quantitative analysis. The results thereof are shown in Table 1 and FIGS. 3 to 5. These results indicate a relative ratio to the diameter W of the cathode side P layer 103 based on each data with the diameter W of the cathode side P layer 103 of 400 µm. Moreover, each data with the diameter W of the cathode side P layer 103 of 0 µm is obtained in a diode having a conventional structure which does not include the cathode P layer 103.

TABLE 1

| W [um] | V ratio | Erec ratio | $V_{p-p}$ ratio |
|---|---|---|---|
| 0 | 0.807 | 1.108 | 63.468 |
| 150 | 0.880 | 0.973 | 8.426 |
| 300 | 0.940 | 0.938 | 1.486 |
| 400 | 1.000 | 1.000 | 1.000 |
| 600 | 1.286 | 1.001 | 0.683 |

Figure 3:
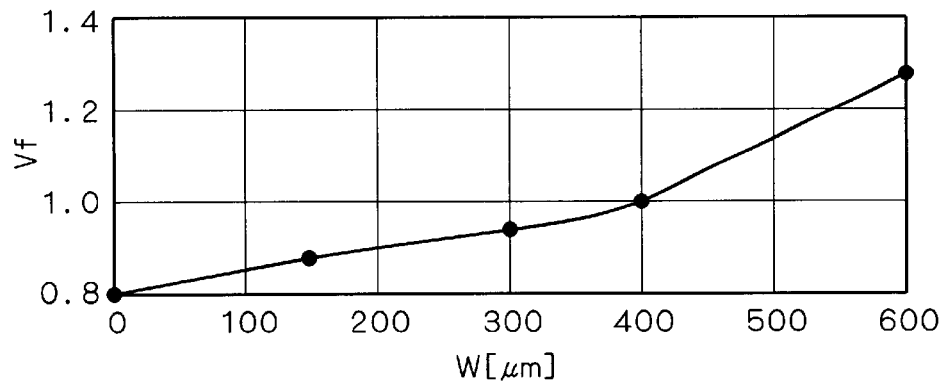
FIG. 3 is a chart showing a simulation result for a relationship between a forward voltage Vf and a diameter W of a cathode side P layer 103 in the diode according to the first embodiment.

First of all, it is apparent from FIG. 3 that the forward voltage Vf is simply increased with an increase in the diameter W. The increase has a great gradient in the vicinity of 400 µm or more. In that region, it is obvious that a high voltage is required for operating the diode during the application of the forward bias. From FIG. 3, consequently, it is apparent that a value of approximately 400 µm or less having a small increase rate of the forward voltage Vf is proper for the diameter W of the cathode side P layer 103.

Figure 4:
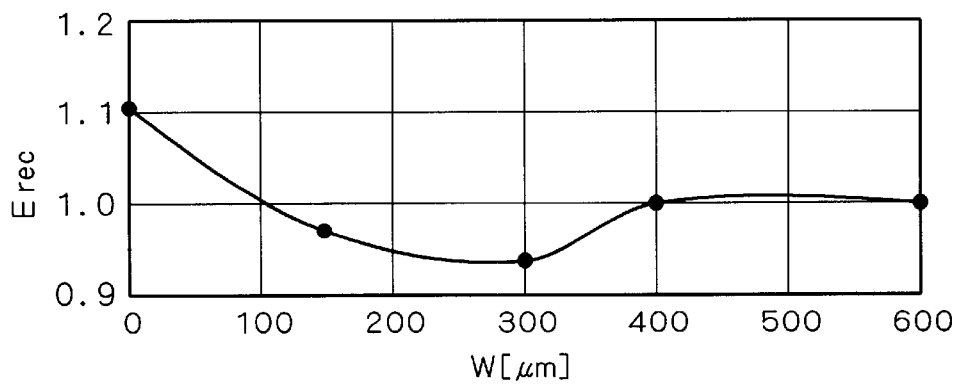
FIG. 4 is a chart showing a simulation result for a relationship between an energy loss Erec produced during a reverse recovery operation and the diameter W of the cathode side P layer 103 in the diode according to the first embodiment.

Moreover, it is apparent from FIG. 4 that the energy loss Erec produced during the reverse recovery operation is decreased with an increase in the diameter W. The decrease tendency is changed to an increase when the diameter W exceeds approximately 300 µm, and is obtained with an almost constant value when the diameter W is 400 µm or more. According to the decision in FIG. 4, therefore, approximately 300 µm with which the energy loss Erec has the smallest value is proper for the diameter W of the cathode side P layer 103. As compared with a conventional diode (data obtained with the diameter W of 0 µm), however, it is obvious that the value of the energy loss Erec is decreased with the cathode side P layer 103 provided irrespective of the value of the diameter W. Therefore, the diameter W is not restricted to a value in the vicinity of 300 µm.

Figure 5:
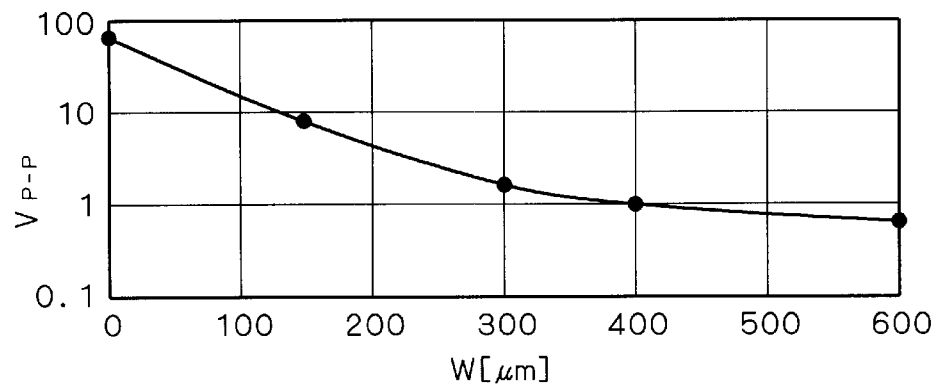
FIG. 5 is a chart showing a simulation result for a relationship between a magnitude $V_{p\text{-}p}$ of a voltage oscillation and the diameter W of the cathode side P layer 103 in the diode according to the first embodiment.

Furthermore, it is apparent from FIG. 5 that the magnitude $V_{p-p}$ of the voltage oscillation is decreased with an increase in the diameter W. The decrease tendency is dampened when the diameter W exceeds approximately 400 µm and the magnitude $V_{p-p}$ of the voltage oscillation is not decreased very greatly (the magnitude $V_{p-p}$ of the voltage oscillation is represented by a logarithmic scale in FIG. 5). Consequently, it is obvious that the diameter W of the cathode side P layer 103 is desirably set to approximately 400 µm or more. As compared with the conventional diode (data obtained with the diameter W of 0 µm), however, the value of the magnitude $V_{p-p}$ of the voltage oscillation is decreased with the cathode side P layer 103 provided irrespective of the value of the diameter W. In a portion having a diameter W of 400 µm or less, particularly, the decrease tendency is marked.

Therefore, it is apparent that the voltage oscillation can be fully suppressed with the diameter W of 400 µm or less.

By comprehensively deciding the foregoing, it is obvious that the diameter W of the cathode side P layer 103 is properly set to approximately 400 µm or less.

Moreover, the present inventors carried out a simulation for a relationship between each of a forward voltage Vf and an energy loss Erec produced during the reverse recovery operation and a rate of a total area of the cathode side P layer 103 occupying a cathode electrode surface. The results thereof are shown in Table 2 and FIG. 6. These results indicate a relative ratio to the rate of the area of the cathode side P layer 103 based on each data with the rate of the area of the cathode side P layer 103 of 37.5%.

TABLE 2

| Rate of Area [%] | Vf ratio | Erec ratio |
|---|---|---|
| 75.0 | 1.614 | 0.885 |
| 50.0 | 1.134 | 0.938 |
| 37.5 | 1.000 | 1.000 |
| 18.8 | 0.866 | 1.107 |
| 12.5 | 0.841 | 1.163 |

Figure 6:
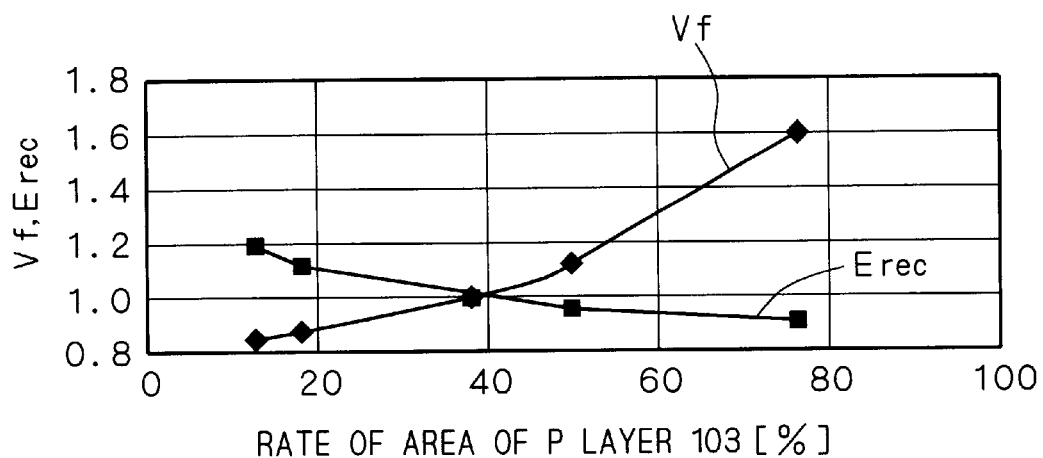
FIG. 6 is a chart showing a simulation result for a relationship between the forward voltage Vf and the energy loss Erec produced during the reverse recovery operation and a rate of the total area of the cathode side P layer 103 occupying a cathode electrode surface in the diode according to the first embodiment.

It is apparent from FIG. 6 that the forward voltage Vf is simply increased with an increase in the rate of the area. The increase has a great gradient in the vicinity of 40% or more. In that region, it is obvious that a high voltage is required for operating the diode during the application of a forward bias. From FIG. 6, consequently, it is apparent that a value of approximately 40% (=2/5) or less having a small increase rate of the forward voltage Vf is proper for the rate of the area of the cathode side P layer 103.

Moreover, it is apparent from FIG. 6 that the energy loss Erec produced during the reverse recovery operation is decreased with an increase in the rate of the area. Accordingly, it is decided from FIG. 6 that the value of the energy loss Erec is desirably decreased if the rate of the area of the cathode side P layer 103 is increased. However, as the rate of the area is increased, the decrease tendency becomes gentler. Therefore, it is also obvious that the energy loss Erec produced during the reverse recovery operation can be controlled effectively even if the rate of the area does not have a greater value than necessary.

By comprehensively deciding the foregoing, it is obvious that the rate of the total area of the cathode side P layer 103 occupying the cathode electrode surface is properly set to approximately 2/5 or less.

The results of the simulation described above have been obtained by setting a thickness of the cathode side P layer 103 to approximately 30 µm. The value of 30 µm has been obtained by optimization based on the results of a breakdown voltage simulation performed in advance.

By using the diode according to the present embodiment, at least one cathode side P layer 103 is formed in a position on the N layer 101 that a depletion layer generated in the N layer 101 does not reach. Therefore, the current density of the reverse current obtained during the reverse recovery operation can be increased, the resistance component of the diode can be prevented from being changed suddenly and the generation of the voltage oscillation can be suppressed. By setting the diameter W of the portion of the cathode side P layer 103 which faces the cathode electrode surface to approximately 400 µm or less, the forward voltage Vf and the energy loss Erec produced during the reverse recovery operation are not increased and the voltage oscillation can be suppressed. By setting the total area of the portion of the cathode side P layer 103 which faces the cathode electrode surface to approximately 2/5 or less of the area of the cathode electrode surface, furthermore, the forward voltage Vf is not increased and the energy loss Erec produced during the reverse recovery operation can be controlled effectively.

Second Embodiment

In the present embodiment, description will be given to a variant of the diode according to the first embodiment.

Figure 7:
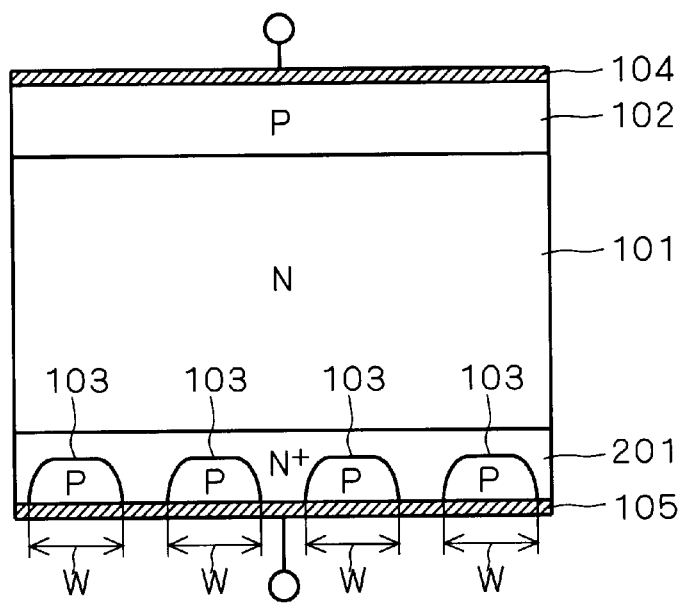
FIG. 7 is a sectional view showing a diode according to a second embodiment.
Figure 8:
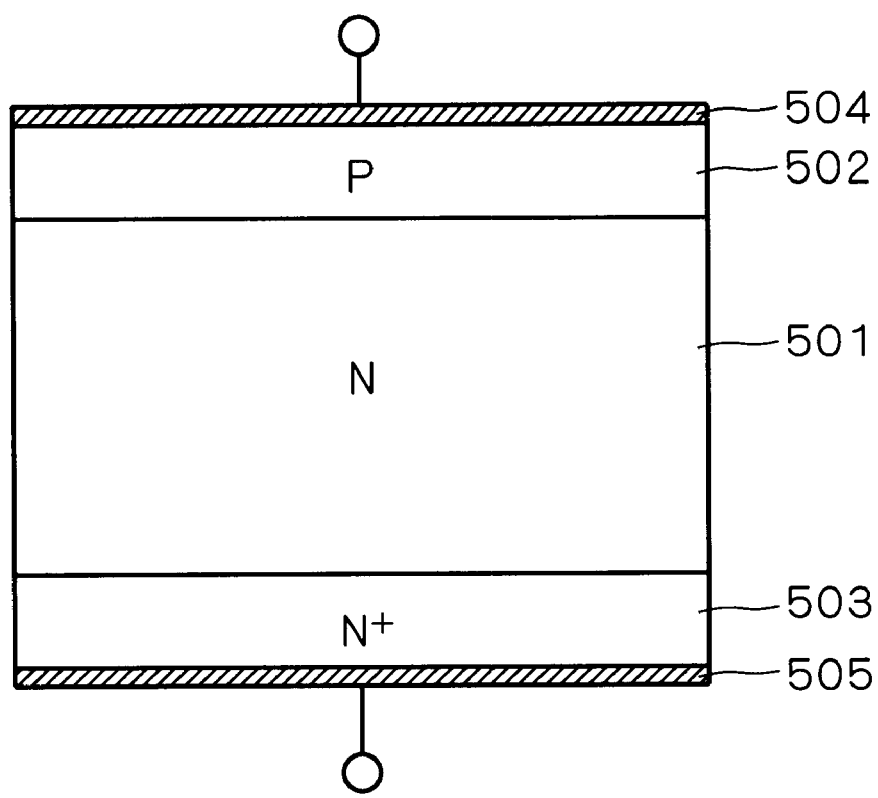
FIG. 8 is a sectional view showing a conventional diode.

FIG. 7 is a view showing a diode according to a second embodiment of the present invention. In FIG. 7, elements having the same functions as in the diode according to the first embodiment have the same reference numerals. As shown in FIG. 7, in the diode according to the present embodiment, an N$^+$ layer 201 having a higher in purity concentration than in an N layer 101 is provided on a cathode electrode 105 side of the N layer 101.

By using the diode according to the present embodiment, the N$^+$ layer 201 is provided. Therefore, a carrier concentration can be effectively increased except a portion to be depleted in the same manner as in the case in which the N$^+$ layer 503 is provided in the conventional diode, thereby making the diode thinner. Furthermore, the carrier concentration is increased. Consequently, a reverse current obtained during a reverse recovery operation can be more increased between the N$^+$ layer 201 and the cathode side P layer 103. Thus, the sudden change of a resistance component of the diode and the generation of a voltage oscillation can be prevented more reliably.

While the invention has been described in detail, the foregoing description is in all aspects illustrative and not restrictive. It is understood that numerous other modifications and variations can be devised without departing from the scope of the invention.

What is claimed is:

1. A diode comprising:

a semiconductor substrate having a first main surface and a second main surface opposed to said first main surface;

a first semiconductor region of a first conductivity type which faces said first main surface and is formed in said semiconductor substrate;

a second semiconductor region of a second conductivity type which faces said second main surface and is formed in said semiconductor substrate adjacently to said first semiconductor region;

at least one third semiconductor region of said first conductivity type formed in a position on said second semiconductor region facing said second main surface that a depletion layer extended from a boundary surface of said first and second semiconductor regions with application of a reverse bias voltage does not reach;

a first electrode formed on said first main surface; and a second electrode formed on said second main surface, wherein said second electrode being in contact with said second semiconductor region and said third semiconductor region, and a distance from said boundary surface of the first and second semiconductor regions to the third semiconductor region is larger than a distance from the boundary surface to the first main surface.

2. The diode according to claim 1, wherein said second semiconductor region has a higher impurity concentration in second main surface side than in first semiconductor region side.

3. The diode according to claim 1, wherein a diameter of a portion of said third semiconductor region which faces said second main surface is approximately 400 µm or less.

4. The diode according to claim 1, wherein a total area of a portion of said third semiconductor region which faces said second main surface is approximately ⅖ or less of an area of said second main surface.

5. A diode comprising:
   a semiconductor substrate having a first main surface and a second main surface opposed to said first main surface;
   a first semiconductor region of a first conductivity type which faces said first main surface and is formed in said semiconductor substrate;
   a second semiconductor region of a second conductivity type which faces said second main surface and is formed in said semiconductor substrate adjacently to said first semiconductor region;
   at least one third semiconductor region of said first conductivity type which faces said second main surface and is formed in said second semiconductor region;
   a first electrode formed on said first main surface; and
   a second electrode formed on said second main surface,
   wherein said second electrode being in contact with said second semiconductor region and said third semiconductor region,
   a distance from a boundary of the first and second semiconductor regions to the third semiconductor region is larger than a distance from the boundary to the first main surface, and
   a diameter of a portion of said third semiconductor region which faces said second main surface is approximately 400 μm or less.

6. The diode according to claim 5, wherein said second semiconductor region has a higher impurity concentration in second main surface side than in first semiconductor region side.

7. A diode comprising:
   a semiconductor substrate having a first main surface and a second main surface opposed to said first main surface;
   a first semiconductor region of a first conductivity type which faces said first main surface and is formed in said semiconductor substrate;
   a second semiconductor region of a second conductivity type which faces said second main surface and is formed in said semiconductor substrate adjacently to said first semiconductor region;
   at least one third semiconductor region of said first conductivity type which faces said second main surface and is formed in said second semiconductor region;
   a first electrode formed on said first main surface; and
   a second electrode formed on said second main surface,
   wherein said second electrode being in contact with said second semiconductor region and said third semiconductor region,
   a distance from a boundary of the first and second semiconductor regions to the third semiconductor region is larger than a distance from the boundary to the first main surface, and
   a total area of a portion of said third semiconductor region which faces said second main surface is approximately ⅖ or less of an area of said second main surface.

8. The diode according to claim 7, wherein said second semiconductor region has a higher impurity concentration in second main surface side than in first semiconductor region side.

* * * * *